United States Patent
Fardad et al.

(10) Patent No.: US 6,908,723 B2
(45) Date of Patent: Jun. 21, 2005

(54) PHOTO-PATTERNABLE MONO-PHASE FLUORINATED ORGANOMETALLIC SOL-GELS FOR INTEGRATED OPTICS AND METHODS OF FABRICATION

(75) Inventors: Amir Fardad, Tucson, AZ (US); Wei Liang, Tucson, AZ (US); Yadong Zhang, Tucson, AZ (US)

(73) Assignee: NP Photonics, Inc., Tucson, AZ (US)

( * ) Notice: Subject to any disclaimer, the term of this patent is extended or adjusted under 35 U.S.C. 154(b) by 341 days.

(21) Appl. No.: 10/222,285

(22) Filed: Aug. 15, 2002

(65) Prior Publication Data
US 2004/0033309 A1 Feb. 19, 2004

(51) Int. Cl.$^7$ .................................................. G03F 7/16
(52) U.S. Cl. ..................... 430/270.1; 430/270.16; 430/281.1; 430/198; 430/322; 430/325; 430/328; 528/10; 522/148; 427/162
(58) Field of Search .................. 430/270.1, 270.16, 430/281.1, 322, 325, 328

(56) References Cited
U.S. PATENT DOCUMENTS

| | | |
|---|---|---|
| 4,814,017 A | 3/1989 | Yoldas et al. |
| 5,100,764 A | 3/1992 | Paulson et al. |
| 5,840,111 A | 11/1998 | Wiederhuft et al. |

OTHER PUBLICATIONS

R. Buestrich et al., ORMOCER's for Optical Interconnection Technology, Journal of Sol–Gel Science and Technology 20, 2001, pp. 181–186, Kluwer Academic Publishers, The Netherlands.

*Primary Examiner*—Yvette C. Thornton
(74) *Attorney, Agent, or Firm*—Eric A. Gifford

(57) ABSTRACT

A photo-patternable perfluorinated silane sol-gel material is presented that exhibits a high refractive index and propagation losses below 1 dB/cm at the telecommunication wavelengths. The sol-gels are produced with general formula $[\Re(CH_2)_n, R'—Si(O)_2]_x—[Si(O)_4]_y—[R'—Si(O)_3]_z—[R''(CH_2)_n—M(O)_3]_w—[R'''(CH_2)_n—Si(O)_3]_v$ where O is oxygen, Si is silicon, M is a metal alkoxyde known to form bonds with organic compounds through oxygen donor ligands, and where $\Re$, R" and R'" are photo cross-linkable groups, and where $(CH_2)_n$ are alkyl spacers with n being an integer $\geq 0$. The sol-gels can be fabricated to produce complex waveguide structures directly onto silica-on-silicon substrates with low bending losses.

25 Claims, 11 Drawing Sheets

PHOTO-PATTERNABLE MONO-PHASE FLUORINATED ORGANOMETALLIC SOL-GELS FOR INTEGRATED OPTICS AND METHODS OF FABRICATION

BACKGROUND OF THE INVENTION

1. Field of the Invention

This invention relates to photo-patternable perfluorinated organometallic silane sol-gels and methods to process the sol-gels into optical waveguides with low optical loss at the telecommunication wavelengths.

2. Description of the Related Art

With the rapid growth of integrated optics, passive and active waveguides are in high demand to implement routing, switching or filtering of optical information. Two-dimensional slab waveguides are obtained by depositing a thin film on a substrate, in which the film's refractive index is higher than that of the substrate and the medium above the film. Most waveguides for integrated optics also confine the optical radiation in the transverse direction leading to rectangular cross-sections with dimensions of a few micrometers. Such waveguides exist in various geometries, including the raised and embedded strip, rib or ridge, and strip-loaded waveguides. Dielectric waveguides have been fabricated using various thin film technologies, including evaporation, sputtering, by epitaxial growth techniques, by ion implantation or ion exchange techniques. All of these techniques, in particular ion implantation, are complex and difficult to implement. Ion exchange is performed on glass substrates and is not compatible with standard silicon processing. Evaporation, sputtering, and epitaxial growth techniques can be implemented on silicon substrates but require multi-step photolithography, followed by etching to define the strip or ridge. Etching is often achieved by reactive ion etching, which leads to walls along the strip or ridge that are rough. These rough walls increase the scattering losses of the waveguide.

For most applications the waveguide should have low optical losses, preferably lower than 1 dB/cm and have high thermal stability. For telecommunication applications, the optical signals have a wavelength between 1300 nm and 1600 nm. Therefore, it is important that the material has low optical losses in this spectral region. As demonstrated with the deployment of silica fibers, glass is a material of choice for the fabrication of waveguides. However, the fabrication of glasses generally requires high processing temperatures (T>1000° C.). Such high temperatures are a severe limitation to the integration of waveguides into optoelectronic circuits.

Sol-gel methods allow the fabrication of glasses from precursors using low temperature processing. Furthermore, sol-gel methods can produce compositions that are not possible with conventional methods. Sol-gels are fabricated at room temperature using a hydrolysis-condensation polymerization reaction of suitable monomers. Early sol-gel materials were obtained from precursors with the general formula $M(OR_1)_4$ where O is oxygen, $R_1$ is an alkyl chain with general formula $C_nH_{2n+1}$, and M is a metal or semiconductor that can form bonds with organic compounds through oxygen donor ligands. Examples for M include but are not limited to silicon (Si), aluminum (Al), titanium (Ti), or zirconium (Zr). When monomers with general structure $M(OR_1)_4$ are used and all four coordinating groups can be hydrolyzed and condensed, leading to a purely inorganic network containing only M—O bonds. Such sol-gels are referred to as purely inorganic sol-gels. For instance, if M=Si, the resulting coating is silica. Inorganic sol-gel films are usually limited to thin films because of the formation of cracks during polymerization and condensation in thick films (thickness>1 micrometer). Thicker films can be fabricated using multilayer approaches.

When at least one of the $OR_1$ alkoxy side-group is replaced with an organic group, the sol-gel with general formula $R_1'$—$M(OR_1)_3$ is referred to as an organically modified sol-gel (e.g. ORMOSIL when M=Si). In this case the element M forms one bond with carbon directly. $R_1'$ in this case can be any organic molecule. With such precursors, M—C bonds do not undergo hydrolysis and thus reduce the coordination to the number of M—O bonds. Due to reduced coordination of M, such materials are less sensitive to the formation of cracks. Waveguide films with good optical quality can be fabricated from such materials.

An example of an ORMOSIL 10 is shown in FIG. 1. In this case, precursors have the general formula $R_1'$—$M(OR_1)_3$, or $R_1'R_1''$—$M(OR_1)_2$, where $R_1$ are alkyl chains such as $CH_3$ or $CH_2CH_3$, and $R_1'$ are alkoxy substituents such as $OCH_3$ or $OC_2H_5$ and $R_1''$ are aromatic substituents such as phenyl or styryl. Possible ORMOSILS include materials with general formula $R_1'R_1''$—$M(OR_1)_2$ with:

$R_1$=—$CH_3$, —$C_2H_5$; $R_1'$=—$OCH_3$, —$OC_2H_5$; $R_1''$=—$C_6F_5$ $R_1$=—$CH_3$, —$C_2H_5$; $R_1'$=—$OCH_3$, —$OC_2H_5$; $R_1''$=—$C_6F_4$—$CF$=$CF_2$ $R_1$=—$CH_3$, —$C_2H_5$; $R_1'$=—$OCH_3$, —$OC_2H_5$; $R_1''$=—$C_6F_4$—$CF$=$CF_2$ $R_1$=—$CH_3$, —$C_2H_5$; $R_1'$=—$OCH_3$, —$OC_2H_5$; $R_1''$=—$C_6F_4$—$CH$=$CH_2$ $R_1$=—$CH_3$, —$C_2H_5$; $R_1'$=—$C_6F_5$; $R_1''$=—$C_6F_5$ $R_1$=—$CH_3$, —$C_2H_5$; $R_1'$=—$CH$=$CH_2$; $R_1''$=—$C_6F_5$ $R_1$=—$CH_3$, —$C_2H_5$; $R_1'$=—$CH_2CH$=$CH_2$; $R_1''$=—$C_6F_5$

Unfortunately, conventional ORMOSILs have high optical loss at the telecommunication wavelengths due to a high concentration of carbon hydrogen and oxygen hydrogen bonds.

A typical absorption spectrum 20 of an ORMOSIL is shown in FIG. 2. Two main absorption bands can be observed: a band 22 located around 1350–1450 nm that originates from O—H bonds, and a band 24 located around 1700 nm that is caused by C—H bonds. In the O—H band two sub-bands can be distinguished, one spectrally narrow band 26 centered at 1375 nm, and a broader band 28 on the low energy side. The spectrally narrow band is assigned to isolated O—H bonds while the broad low energy shoulder is assigned to the formation of O—H dimers by hydrogen bonding. When the density of O—H bonds is reduced, the formation of dimers is less likely and the broad band absorption is reduced.

Standard waveguide fabrication includes the use of a photoresist that is coated on top of the sol-gel film. After exposure and development of the photoresist, reactive ion etching techniques are used to define waveguides into the deposited sol-gel material. As mentioned above, this process often generates rough walls along the structures, which in turn generates optical scattering losses. The capability to pattern the sol-gel directly using standard photolithographic techniques would reduce the number of steps required to fabricate the waveguide in the sol gel materials. UV patternable sol-gels can be exposed directly and developed and do not require any dry etching. This leads to structures with lower roughness and consequently low loss. UV patterning through UV cross-linking is well known in organic materials and sol-gels (see for instance Buestrish et al., J. of Sol-Gel Science and Technology, Vol. 20, p 181–186, 2001). FIG. 3 shows chemical functional groups that are commonly used for cross-linking upon exposure to UV radiation. They include include epoxy 30, oxetanyl 31, vinyl 32, methacryloxy 33, acryloxy 34, cinnamate 35, or chalcone 36. After cross-linking the new bonds that are formed between organic chains lead to an insoluble three-dimensional network. Groups 30–34 require the addition of a photoinitiator, while cinnamate 35 and chalcone 36 do not.

Examples of methods of making patterned metal oxide films through the sol-gel method can be found in U.S. Pat. No. 5,100,764 to Paulson et al. However, no methods to make low loss waveguides for the telecommunication wavelength are described.

A well established scheme to reduce loss due to C—H bonds is to replace such C—H bonds with C—F bonds. The loss around 1550 nm is due to overtones of the C—H stretching mode. By changing the nature of the elements involved in the bond, the energy of the vibration eigenmodes will be shifted to different wavelengths (energy of C—H bond stretch is 3500 cm$^{-1}$ and that of C—F bond stretch is 1000 cm$^{-1}$). This replacement of C—H bonds with C—F bonds to reduce optical loss is referred to as perfluorination. In addition to its heavy mass, fluorine has two great advantages of hydrophobicity and bond stiffness, which further reduce absorption and improve the material's stability. However, the replacement of C—H bonds with C—F bonds is also known to reduce the refractive index of the material. This is a problem because to define a waveguide in a sol-gel, the refractive index of the sol-gel must be higher than that of the substrate.

Organically modified sol-gels generally have a refractive index that is lower than silicon when they contain a high number of C—F bonds. These C—F bonds are required to reduce the absorption at the telecommunication wavelengths. Therefore, a low index sol-gel or other organic buffer layer is required between the sol-gel waveguide and the substrate thereby increasing the number of fabrication steps. The index of the buffer layer is generally reduced by further increasing the degree of fluorination in the sol-gel precursors. Following this approach, the index difference between cladding and the waveguide core is small and limits the optical confinement. This in turn, limits the bending radii of the waveguide structures and consequently the footprint of complex waveguide structures such as arrayed waveguide gratings.

Another way to increase the refractive index of a silica based material is to insert titanium oxide. This can be done for instance by doping the glass with nanodispersion of titanium dioxide as described in U.S. Pat. No. 5,840,111 to Wiederhoft et al. or by inserting metals such as titanium or zirconium into the sol-gel composition itself as described in U.S. Pat. No. 4,814,017 to Yoldas et al. Unfortunately, organoalkoxysilane/metal oxide with general formula $R_1$—$[Si(O)_3]_n$—$[Ti(O)_3]_m$—$R_1$ are not photopatternable and have high optical loss.

Known sol-gels and methods of fabrication have failed to produce high refractive index sol-gels that can be directly fabricated onto silica-on-silicon substrates or photo-patterned into complex waveguide structures with low bending losses and propagation losses below 1 dB/cm at the telecommunication wavelengths.

SUMMARY OF THE INVENTION

In view of the above problems, the present invention provides a sol-gel material and methods of fabrication to produce high refractive index sol-gels directly fabricated onto silica-on-silicon substrates or photo-patterned into complex waveguide structures with low bending losses and propagation losses below 1 dB/cm at the telecommunication wavelengths.

This is accomplished with a perfluorinated silane sol-gel material having general formula $[\Re(CH_2)_n R_1'\text{—}Si(O)_2]_x$—$[Si(O)_4]_y$—$[R'\text{—}Si(O)_3]_z$—$[R''(CH_2)_n\text{—}M(O)_3]_w$—$[R'''(CH_2)_n\text{—}Si(O)_3]_v$ where M is a refractive index adjuster preferably titanium (Ti) but can be any other metal alkoxyde known to form bonds with organic compounds through oxygen donor ligands. Elements for M include, but are not limited to, zirconium (Zr), hafnium (Hf), vanadium (V), niobium (Nb), tantalum (Ta), molybdenum (Mo), or tungsten (W), and where $\Re$, R" and R'" are photo cross-linkable groups such as epoxy, oxetanyl, vinyl, methacryloxy, acryloxy, cinnamate, or chalcone, and where R' is a perfluorinated aromatic group such as pentafluorophenyl. The photodefinable groups $\Re$, R" and R'" can be attached through an alkyl spacer with formula $(CH_2)_n$ where n is an integer $\geq 0$.

The sol-gel material is suitably prepared by mixing an organically modified silane precursor with general formula $[R'\text{—}Si(OR)_3]$ where R is either $CH_3$ or $C_2H_5$ and where R' is a perfluorinated group with an acidic water solution and stirred until the OR groups are partially hydrolyzed. An organically modified silane precursor with general formula $[\Re(CH_2)_n, R'\text{—}Si(OR)_3]$ where $\Re$ is a photo-crosslinkable group is added and the solution is stirred until good mixing of the compounds is achieved. More acidic water solution is added and the solution is stirred until the OR groups in the second silane precursor are partially hydrolyzed. A third organometallic silane precursor with general formula $[R''(CH_2)_n\text{—}Ti(OR)_3]$ where R" is a photo-crosslinkable group that is selected from the same group as $\Re$ but is not necessarily identical is added and the solution is stirred until good mixing of the compounds is achieved. Water is added and the solution is stirred until the third precursor is partially hydrolyzed. The solution is continuously stirred and the solvents left from the hydrolysis reactions are removed, yielding a co-oligomer sol. The mixture is aged for several hours to enable condensation. To further complete hydrolysis, the mixture is then diluted again in a solvent and stirred. Water is added and the solution is stirred again to complete hydrolysis. Finally, the solution is aged until it has the desired viscosity to be fabricated into thin films using spin-coating.

Channel waveguides are fabricated by UV patterning the sol-gel. The sol is spin coated on top of a $SiO_2$ layer on a silicon wafer and undergoes a soft bake to remove remaining solvents. The films is UV-exposed through a lithographic mask using a standard mask aligner until the exposed material is cross-linked. Following exposure, the film is baked, developed and subjected to a post UV-exposure. The film is then baked for an extended period of time to densify the material.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a sol-gel material and methods of fabrication to produce high refractive index sol-gels directly fabricated onto silica-on-silicon substrates or photo-patterned into complex waveguide structures with low bending losses and propagation losses below 1 dB/cm at the telecommunication wavelengths.

Figure 4A:
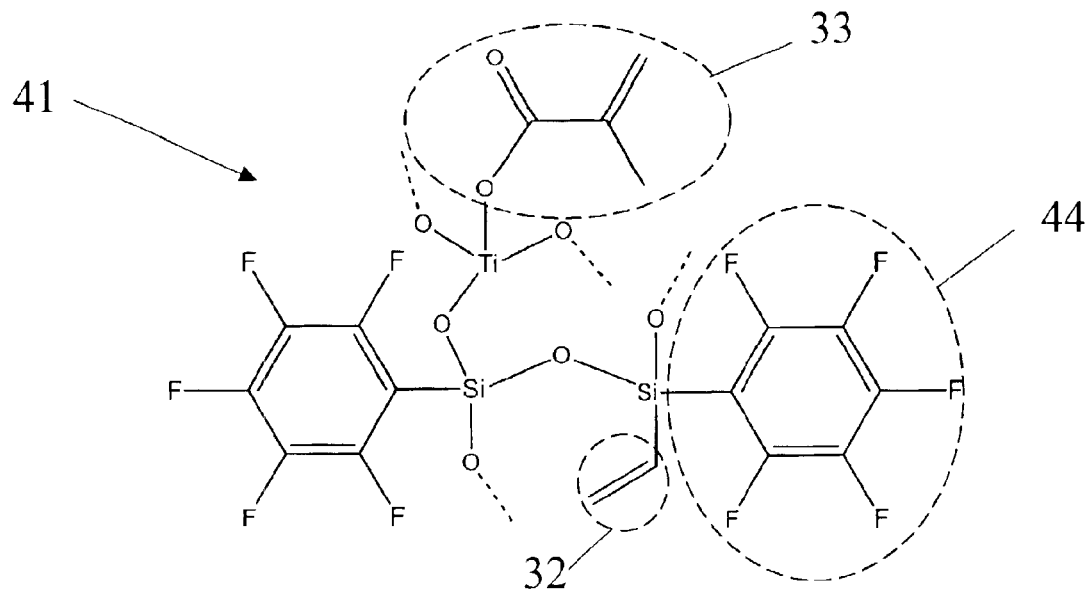
FIGS. 4a–4c illustrate different sol-gels in accordance with the present invention.
Figure 4B:
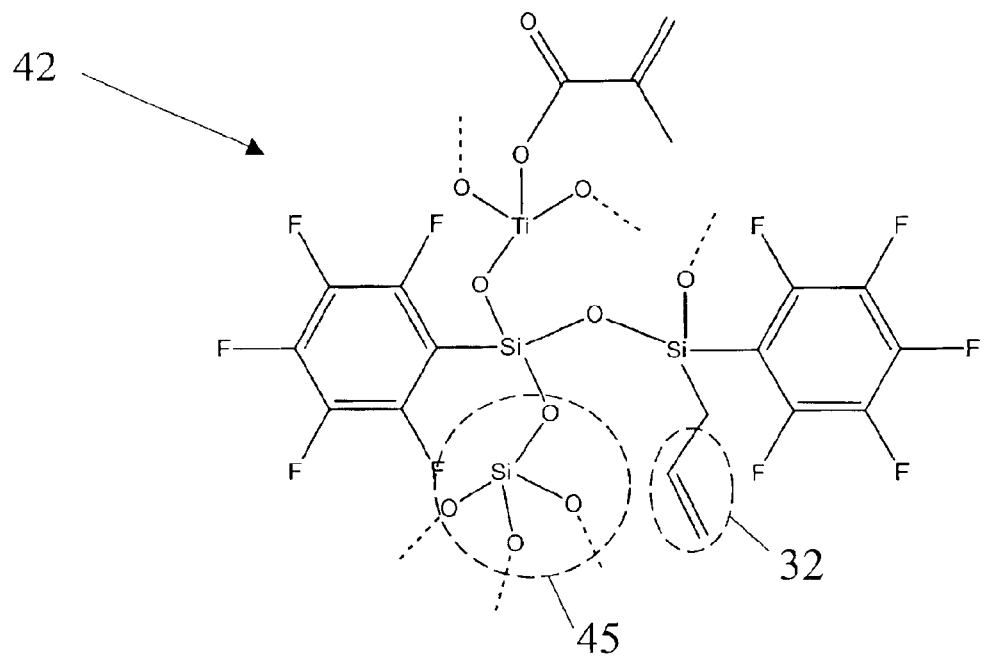
Figure 4C:
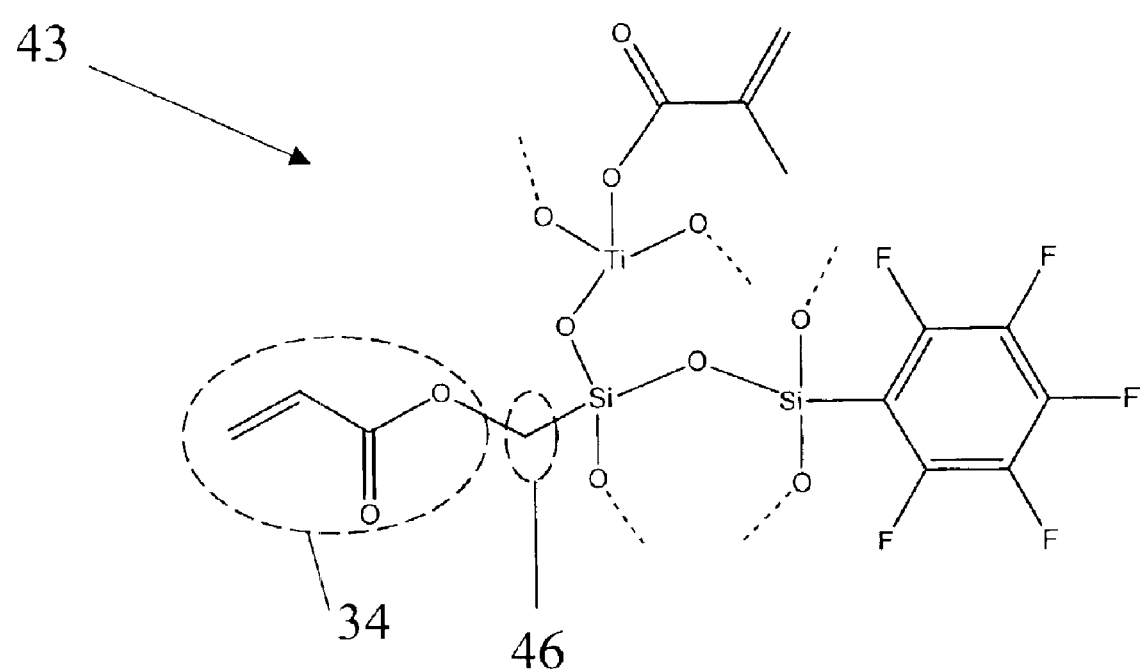

As shown in FIGS. 4a–4c, this is accomplished with a perfluorinated silane sol-gel materials having general formula $[\Re(CH_2)_n,R'\text{—}Si(O)_2]_x\text{—}[(Si(O)_4]_y\text{—}[R'\text{—}Si(O)_3]_z\text{—}[R''(CH_2)_n\text{—}M(O)_3]_w\text{—}[R'''(CH_2)_n\text{—}Si(O)_3]_v$, where x, y, z, w and v are the molar percentages of the precursors. M is a refractive index adjuster preferably titanium (Ti) but can be any other metal alkoxyde known to form bonds with organic compounds through oxygen donor ligands. Elements for M include, but are not limited to, zirconium (Zr), hafnium (Hf), vanadium (V), niobium (Nb), tantalum (Ta), molybdenum (Mo), or tungsten (W), and where $\Re$, R" and R'" are photo cross-linkable groups such as epoxy, oxetanyl, vinyl, methacryloxy, acryloxy, cinnamate, or chalcone, and where R' is a perfluorinated aromatic group such as pentafluorophenyl. The photodefinable groups $\Re$, R" and R'" can be attached through an alkyl spacer with formula $(CH_2)_n$ where n is an integer $\geq 0$. A sol-gel composition according to the general formula, wherein x is between 40 and 50, y is between 0 and 20, z is between 40 and 50, w is between 5 and 10, and v is between 30 and 50.

More specifically, as shown in FIG. 4a, sol-gel 41 is composed of a silane network containing titanium alkoxides. To provide for good mechanical stability, the sol-gel is organically modified and some Si—O bonds are replaced with Si—R' bonds where R' is pentafluorophenyl 44. The aromaticity of this group compared with alkyl groups that are used in many organically modified sol-gels provides a higher refractive index and compensates for refractive index reduction caused by the C—F bonds. These C—F bonds are selected because they provide in return good optical transparency at the telecommunication wavelength. For the material to be optically definable, the network contains photodefinable groups. In material 41 these groups are vinyl 32 and methacryloxy 33 and are respectively connected to a silicon atom, and a titanium atom.

The general formula for perfluorinated silane sol-gel materials has been modified from other such materials known in the art by combining in a single material pentafluorophenyl 44 and photodefinable groups in a silane/titanium oxide network. This combination provides the following properties simultaneously: 1) good film forming properties; 2) low loss at the telecommunication wavelengths due to low concentrations of C—H and C—O bonds; 3) high refractive index due to the presence of titanium and aromatic groups; 4) patternability with UV light due to photodefinable groups. To the best of our knowledge, all these properties have never been combined in any known prior sol-gel combination.

In the sol-gel example 42 shown in FIG. 4b, the network also contains silicon atoms 45 that form four bonds with oxygen. In sol-gel 42, the vinyl photodefinable group 32 is connected to silicon through a methyl group $CH_2$. In example 43 shown in FIG. 4c, all silicon atoms form three bonds with oxygen atoms and the fourth bond is formed with either a pentafluorophenyl 44 or the photodefinable group acryloxy 34 connected to the silicon atom through a methyl group $CH_2$ 46.

Figure 5:
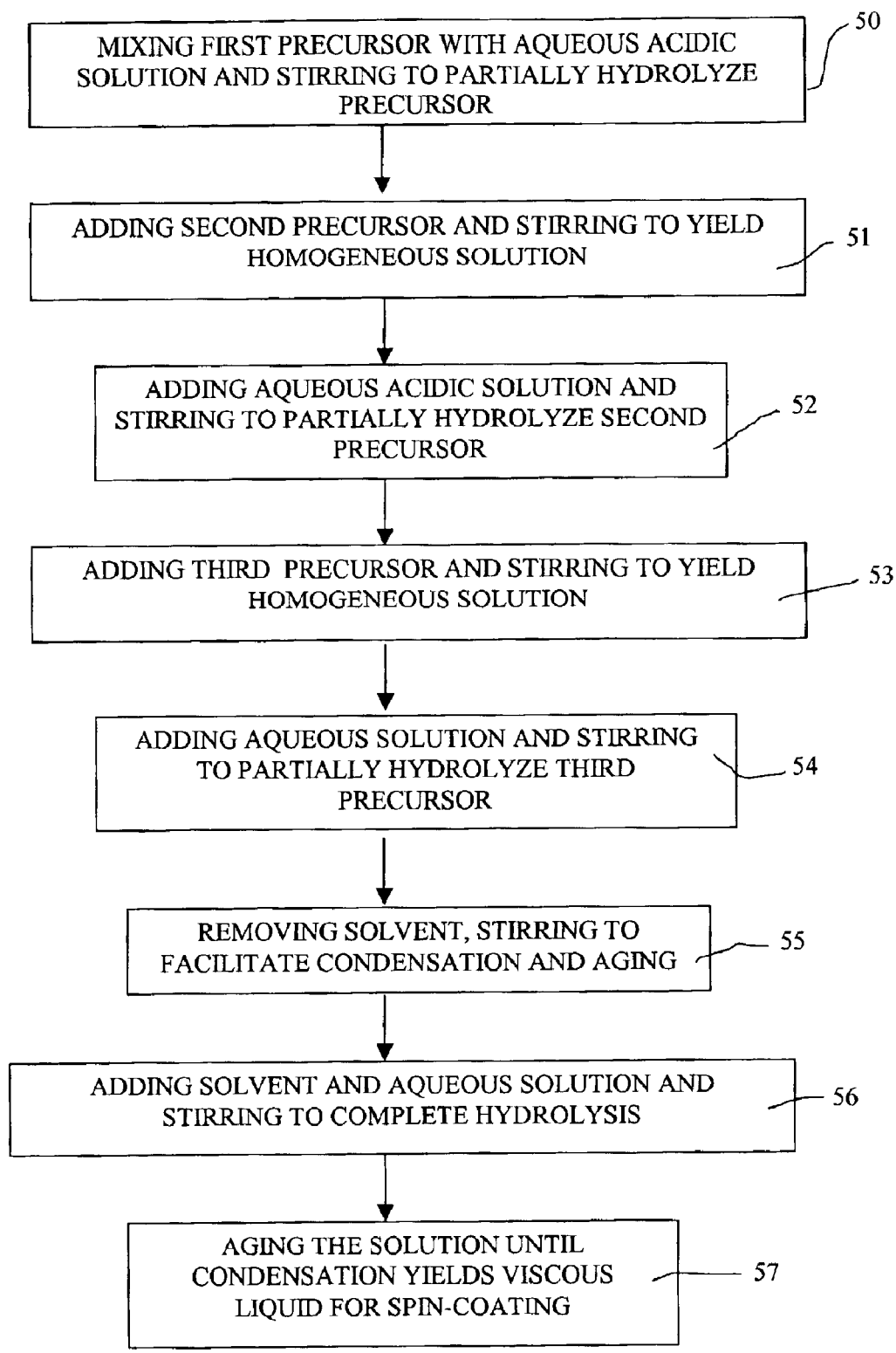
FIG. 5 is a flowchart of a method of forming the sol-gels in accordance with the present invention.

The sol-gel material is suitably prepared according to the process depicted in FIG. 5. First in step 50, an organically modified silane precursor with general formula $[R'\text{—}Si(OR)_3]$ where R is either $CH_3$ or $C_2H_5$ and where R' is a perfluorinated group such as pentafluorophenyl, is mixed with aqueous HCl or any other acidic water solution and stirred until the OR groups are partially hydrolyzed. The amount of aqueous HCl is chosen such that approximately one third of the OR groups can get hydrolyzed. To this solution, an organically modified silane precursor with general formula $[\Re(CH_2)_n,R'\text{—}Si(OR)_3]$ is added (step 51). Here $\Re$ is a photo-crosslinkable group. The solution is stirred until good mixing of the compounds is achieved (step 51). Then, aqueous HCl or any other acidic water solution is added and the solution is stirred until the OR groups in the second silane precursor are partially hydrolyzed (step 52). Here again the amount of aqueous HCl is chosen such that approximately one third of the OR groups of the second precursor can get hydrolyzed. A third organometallic silane precursor with general formula $[R''(CH_2)_n\text{—}Ti(OR)_3]$ is added (step 53), where R" is a photo-crosslinkable group that is selected from the same group as $\Re$ but is not necessarily identical. The solution is stirred until good mixing of the compounds is achieved (step 53). Then, water is added and the solution is stirred until the third precursor is partially hydrolyzed (step 54). In steps 50 through 54 the stirring time in each step can be 30 minutes. The solution is then continuously stirred and the solvents left from the hydrolysis reactions are removed, yielding a co-oligomer sol (step 55). The mixture is aged for several hours to enable condensation. Typical aging time is 16 hours. To further complete hydrolysis, the mixture is then diluted again in a solvent and stirred (step 56) for a few minutes. Water is added and the solution is stirred again for about 30 minutes to complete hydrolysis (step 56). Finally, the solution is aged until it has the desired viscosity to be fabricated into thin films using spin-coating (step 57).

The fluorinated precursors must be prepared before the actual sol-gel materials. Examples of such precursors are shown in FIGS. 6. In the course of this description, we will describe for illustrative purposes, organotitano-silanes hybrid sol-gels, but a person of ordinary skill in the art will recognize that other compositions combining silane or germanate with other metals tantalum (Ta), zirconium (Zr), niobium (Nb), or yttrium (Y) can also be prepared without departing from the spirit and scope of the present invention.

Figure 6A:
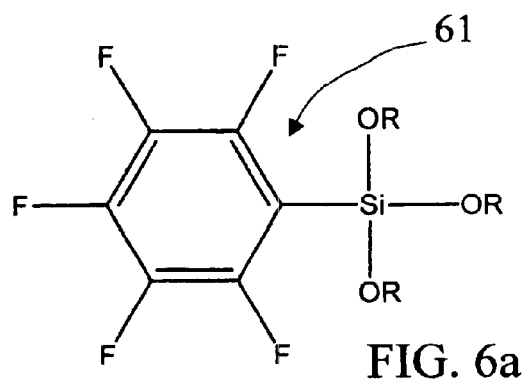
FIGS. 6a through 6e shows different precursors prepared for the synthesis of the sol-gels of the present invention.
Figure 6D:
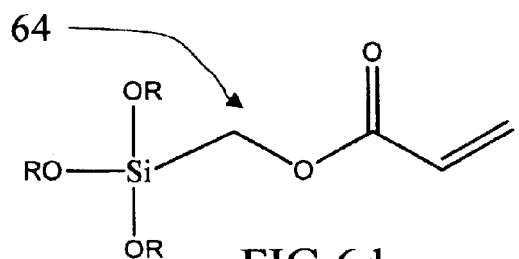
Figure 6B:
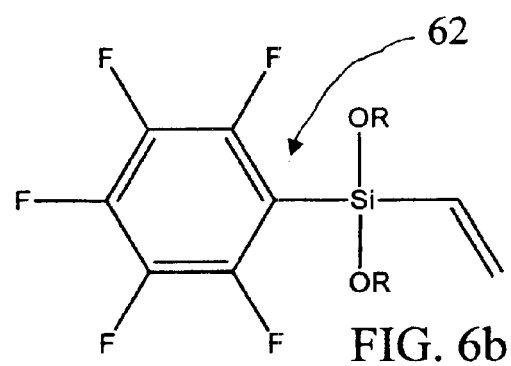
Figure 6E:
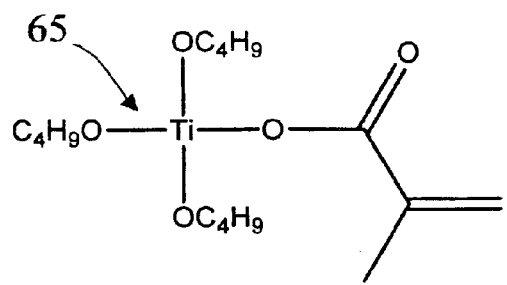
Figure 6C:
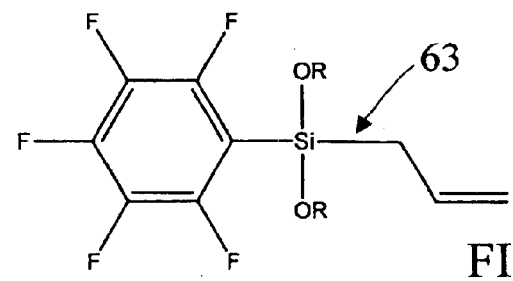
Figure 7:
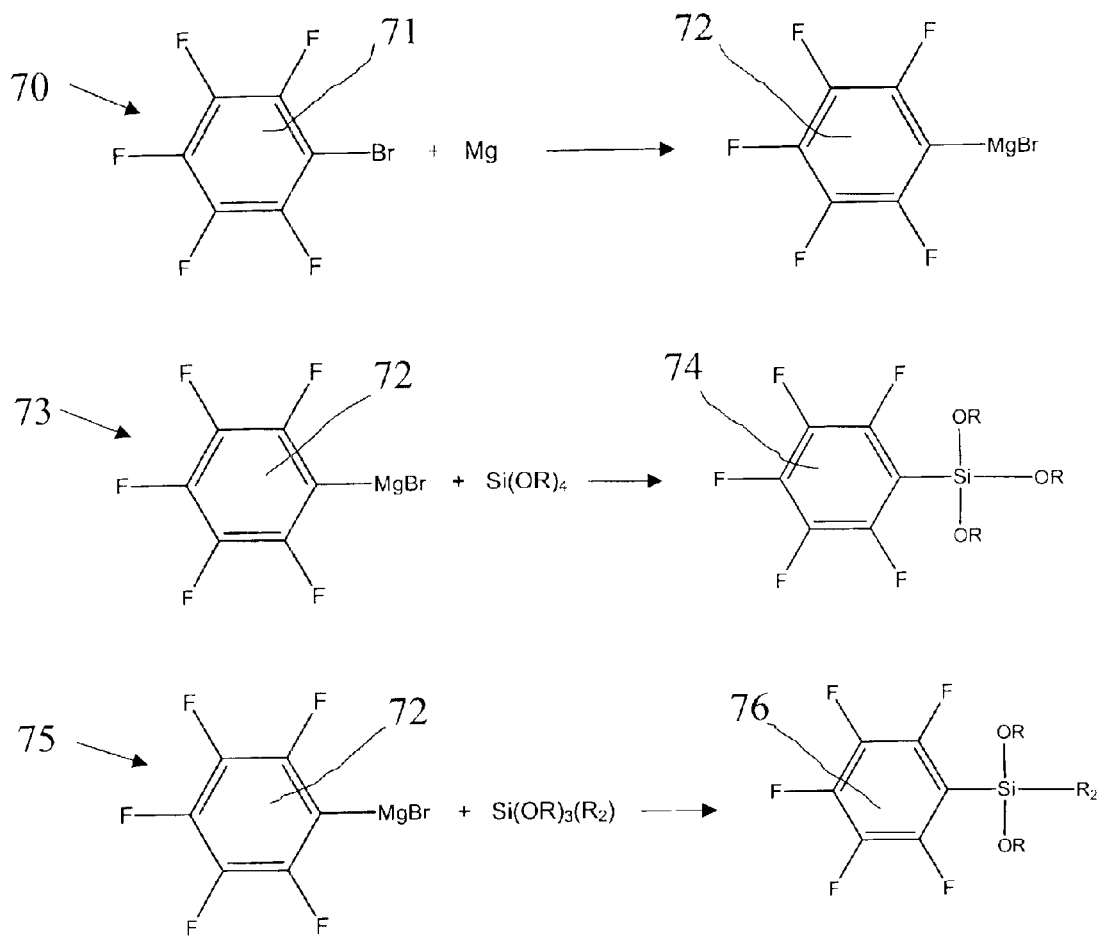
FIG. 7 illustrates the synthesis of the fluorinated precursors used in the present invention.

Precursors 61, 62 and 63 in FIGS. 6a through 6c, respectively, are prepared following a Barbier-Grignard reaction described in FIG. 7. With the Barbier-Grignard synthesis, it is possible to substitute alkoxy-silanes with organic groups (R') where R' is CH=CH$_2$ or CH$_2$CH=CH$_2$ to obtain compounds with the general formula (R$_2$)$_n$M(OR)$_{4-n}$ where M=Si, Ti and R=CH$_3$ or C$_2$H$_5$. In the reaction 70, the perfluorinated organic compound 71 is first reacted with Mg to yield the compound 72 which in reaction 71 is reacted with Si(OR)$_4$ to yield compound 74. In the reaction 72, the perfluorinated 72 is reacted with R$_2$Si(OR)$_3$ to yield compound 76. All the reactions are carried out in a dry nitrogen atmosphere. Ether is used as solvent and is freshly distilled from sodium under pure nitrogen. The GCMS is carried out on HP6890 Series GC system and 5973 Mass selective detectors. The temperature is programmed from 40° C. to 320° C. and varied at a rate of 10° C./min.

For illustration, we describe below the procedure to obtain material 61 described in FIG. 6a. Pentafluorobromobenzene bromide (40 g, 161.9 mmol) in ether (40.0 ml) is added dropwise to the vigorously stirred mixture of diethyl ether (60 ml) and magnesium turnings (4.8 g, 197.5) at room temperature, and heated by a heat gun several times to induce the Grignard reaction. When a vigorous reaction is observed, an ice bath is necessary to maintain a gentle reflux. After the Grignard reaction is induced, stirring and refluxing is continued until pentafluorobromobenzene is consumed, as indicated by GCMS (in about 15 mins. almost 100% of the Grignard reagent is formed). Then, the reaction mixture is cooled with ice. After 30 min. of cooling, Si (OCH$_3$)$_4$ 75 g (492.8 mmol) is added into the mixture in one portion at >5° C. The nucleophilic substituted reaction is kept at reflux for another 30 min. GCMS analysis indicates that the reaction is complete.

The progress of the reaction is followed by removing samples periodically and by CGMS analysis. When the C$_6$F$_5$MgBr is consumed, as indicated by GCMS, the reaction mixture is cooled to room temperature. Excess n-heptane is added to precipitate the magnesium salts and filtered under a reduced pressure, the brown precipitate is washed by n-heptane three times until the color of precipitate is changed to pale yellow. The solution is concentrated on a rotary evaporator and then fractionally distilled to give Pentafluorophenyl-trimethoxysilane (PFPTMS) 37.5 g (80.3%) with b.p. 57~58° C./0.5 Torr. This method provides a convenient synthesis for various polyfluoroaromatic magnesium compounds in high yields. The target product was characterized by GC-MS (M$^+$/Z: 288). Precursors 62 and 63 are synthesized by the similar procedures.

Precursors 64 and 65 in FIGS. 6d and 6e are synthesized via nucleophilic substitution. Precursor 64 was synthesized from a solution of chloromethyl-triethoxysilane (44 g, 207 mmol) and sodium acrylate (46 g, 489 mmol) in DMF (100 ml) and by adding sodium iodide (1 g) under stirring at room temperature. The reaction is heated to 90° C. and kept at this temperature for 48 h. After cooling, ether (500 ml) is added. After 2 h stirring, solid salts are removed by filtration. The solution is fractionally distilled to give precursor 64 in 32.4 g (63.0%) at b.p. 83–85° C./4 Torr. The target product was characterized by GC-MS (M$^+$/Z: 248). For precursor 65, titanium tetrabutoxide reacts with methacrylic acid in a stoichiometric molar ratio. The reaction is carried out without any solvent. Titanium tetrabutoxide (50.0 g, 147 mmol) is placed in a 250 ml three neck flask equipped with a funnel for addition, a magnetic stirrer, a thermometer and a distillation column. The flask is heated to a temperature of 58° C. and a pressure of 65 mmHg under vigorous stirring. Methacrylic acid (12.7 g, 147 mmol) is added dropwise to the titanium tetrabutoxide. Butyl alcohol is fractioned off continuously and the desired product, precursor 65, is obtained as a pale yellow, liquid. After addition of methacrylic acid, the reaction is carried out for 10 h at 58° C. and 65 mmHg. The yield of this reaction was 50.2 g (96.9%). The crude product was not purified as it decomposed at high temperature.

The preparation of the perfluorinated silane sol-gel materials having general formula [$\Re$(CH$_2$)$_n$R'—Si(O)$_2$]$_x$—[Si(O)$_4$]$_y$—[R'—Si(O)$_3$]$_z$—[R''(CH$_2$)$_n$M(O)$_3$]$_w$—[R'''(CH$_2$)$_n$—Si(O)$_3$]$_v$ illustrated in FIGS. 4a–4c are now further described in the following non-limitative examples:

EXAMPLE 1

The sol-gel 41 described in FIG. 4a is prepared by mixing 2.31 ml of pentafluorophenyl triethoxy silane with 0.2 ml of aqueous (0.01 M) HCl and stirring for 30 minutes. 2.09 ml of pentafluorophenyl vinyl diethoxy silane is added and the solution is stirred for another 30 minutes. 0.16 ml of aqueous (0.01 M) HCl is added, stirred for 30 minutes, and 0.6 ml of tributoxytitanium methacrylate is added. The solution is stirred again for 30 minutes. 0.03 ml of H$_2$O is added and the solution is stirred for 16 hours at ambient conditions. To obtain completely co-oligomer sol, all released solvents due to hydrolysis reaction are removed by rotavapor under reduced pressure 5 Torr for 60 min. After solvant removal, highly viscous co-oligomer sols with Ti surrounded by Si are obtained. The solution is aged for several hours, diluted with 5 ml of ethanol (Volume ratio of precursor and solvent is 1:1) and stirred for a few minutes, followed by adding 0.66 ml of H$_2$O to complete hydrolysis. After 30 minutes, 0.03 ml of a photo-initiator HMPP (hydroxy methyl propiophenon) is added and the whole solution is stirred and aged for 16 hrs before coating.

EXAMPLE 2

The preparation is carried out as in Example 1 except that pentafluorophenyl trimethoxy silane is used as a starting precursor. Since the molecular weight and density of each precursor is different, the relative volumes of precursors, aqueous HCl and water have to be adjusted for each composition to maintain the relative number of molecules per unit volume of all the constituents constant. In this example, 2.01 ml of pentafluorophenyl trimethoxy silane is mixed with 0.17 ml of aqueous (0.01 M) HCl and stirred for 30 minutes. 2.32 ml of pentafluorophenyl vinyl diethoxy silane is added and stirred for another 30 minutes. 0.17 ml of aqueous (0.01 M) HCl is added. After stirring the solution for 30 minutes, 0.67 ml of tributoxytitanium methacrylate is added. The solution is stirred again for 30 minutes. 0.04 ml of H$_2$O is added and the solution is stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is aged for several hours, diluted with 5 ml of ethanol (Volume ratio of precursor and solvent is 1:1) and stirred for a few minutes, followed by adding 0.77 ml of H$_2$O to complete hydrolysis. After 30 minutes 0.03 ml of a photo-initiator HMPP (hydroxy methyl propiophenon) is added and whole solution is stirred and aged for 16 hrs before coating.

EXAMPLE 3

In this example, 2.6 ml of pentafluorophenyl triethoxy silane is mixed with 0.18 ml of aqueous (0.01 M) HCl and stired for 30 minutes. 1.72 ml of pentafluorophenyl vinyl dimethoxy silane is added and the solution is stirred for another 30 minutes. 0.18 ml of aqueous (0.01 M) HCl is added. After stirring the solution for 30 minutes, 0.68 ml of tributoxytitanium methacrylate is added. The solution is stirred again for 30 minutes. 0.04 ml of $H_2O$ is added and stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is then aged for several hours, diluted with 5 ml of ethanol (Volume ratio of precursor and solvent is 1:1) and stirred for a few minutes, followed by adding 0.78 ml of $H_2O$ to complete hydrolysis. After 30 minutes 0.03 ml of a photo-initiator HMPP (hydroxy methyl propiophenon) is added and whole solution is stirred and aged for 16 hrs before coating.

EXAMPLE 4

In this example, 2.29 ml of pentafluorophenyl trimethoxy silane is mixed with 0.2 ml of aqueous (0.01 M) HCl and the solution is stirred for 30 minutes. 1.95 ml of pentafluorophenyl vinyl dimethoxy silane is added and the solution is stirred for another 30 minutes. 0.2 ml of aqueous (0.01 M) HCl is added. After stirring the solution for 30 minutes, 0.76 ml of tributoxytitanium methacrylate is added. The solution is stirred again for 30 minutes. 0.04 ml of $H_2O$ is added and the solution is stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is then aged for several hours, diluted with 5 ml of ethanol (Volume ratio of precursor and solvent is 1:1) and stirred for a few minutes, followed by adding 0.88 ml of $H_2O$ to complete hydrolysis. After 30 minutes 0.03 ml of a photo-initiator HMPP (hydroxy methyl propiophenon) is added and whole solution is stirred and aged for 16 hrs before coating.

EXAMPLE 5

In this example, 2.43 ml of pentafluorophenyl triethoxy silane is mixed with 0.16 ml of aqueous (0.01 M) HCl and the solution is stirred for 30 minutes. 1.94 ml of pentafluorophenyl allyl dimethoxy silane is added and the solution is stirred for another 30 minutes. 0.16 ml of aqueous (0.01 M) HCl is added. After stirring the solution for 30 minutes, 0.63 ml of tributoxytitanium methacrylate is added. The solution is stirred again for 30 minutes. 0.04 ml of $H_2O$ is added and the solution is stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is then aged for several hours, diluted with 5 ml of ethanol (Volume ratio of precursor and solvent is 1:1) and stirred for a few minutes, followed by adding 0.73 ml of $H_2O$ to complete hydrolysis. After 30 minutes 0.03 ml of a photo-initiator HMPP (hydroxy methyl propiophenon) is added and whole solution is stirred and aged for 16 hrs before coating.

EXAMPLE 6

In this example, 2.12 ml of pentafluorophenyl triethoxy silane is mixed with 0.18 ml of aqueous (0.01 M) HCl and the solution is stirred for 30 minutes. 2.17 ml of pentafluorophenyl allyl dimethoxy silane is added and the solution is stirred for another 30 minutes. 0.18 ml of aqueous (0.01 M) HCl is added. After stirring the solution for 30 minutes, 0.71 ml of tributoxytitanium methacrylate is added. The solution is stirred again for 30 minutes. 0.04 ml of $H_2O$ is added and the solution is stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is then aged for several hours, diluted with 5 ml of ethanol (Volume ratio of precursor and solvent is 1:1) and stirred for a few minutes, followed by adding 0.82 ml of $H_2O$ to complete hydrolysis. After 30 minutes 0.03 ml of a photo-initiator HMPP (hydroxy methyl propiophenon) is added and whole solution is stirred and aged for 16 hrs before coating.

EXAMPLE 7

Figure 1:
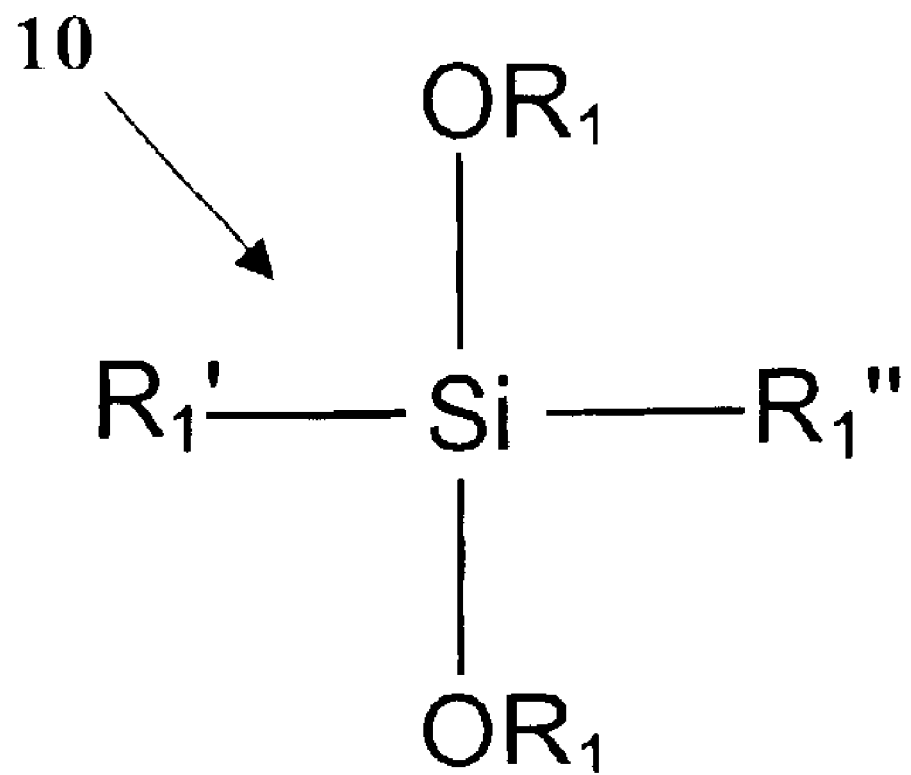
FIG. 1, as described above, illustrates an example of a known ORMOSIL sol-gels.
Figure 2:
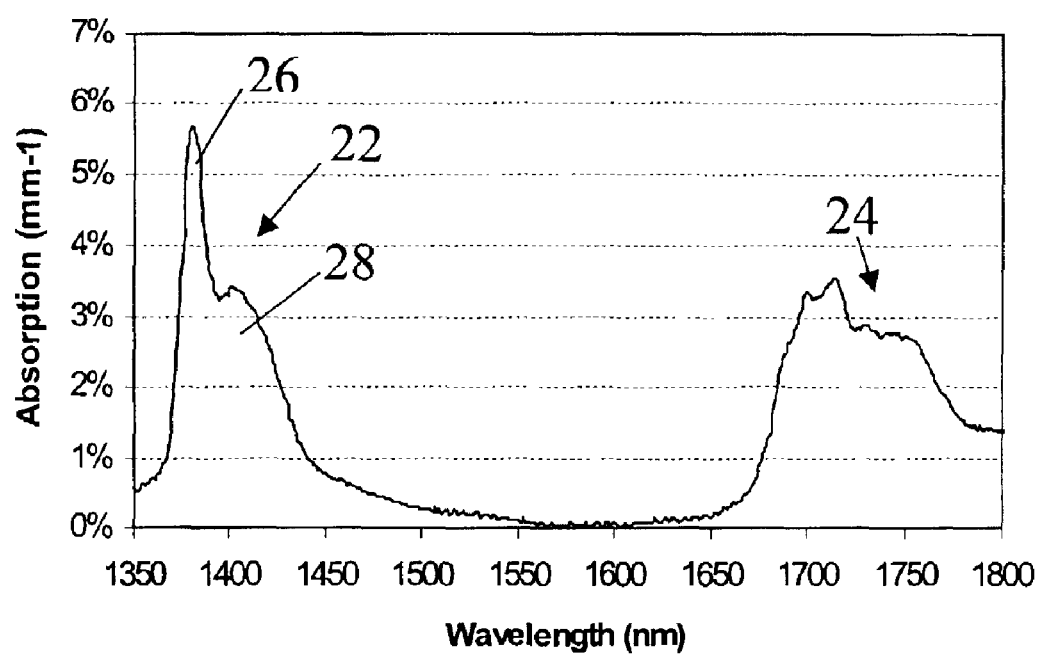
FIG. 2, as described above, depicts the absorption spectrum of an ORMOSIL sol-gel FIG. 3, as described above, illustrates photocrosslinkable groups.
Figure 3:
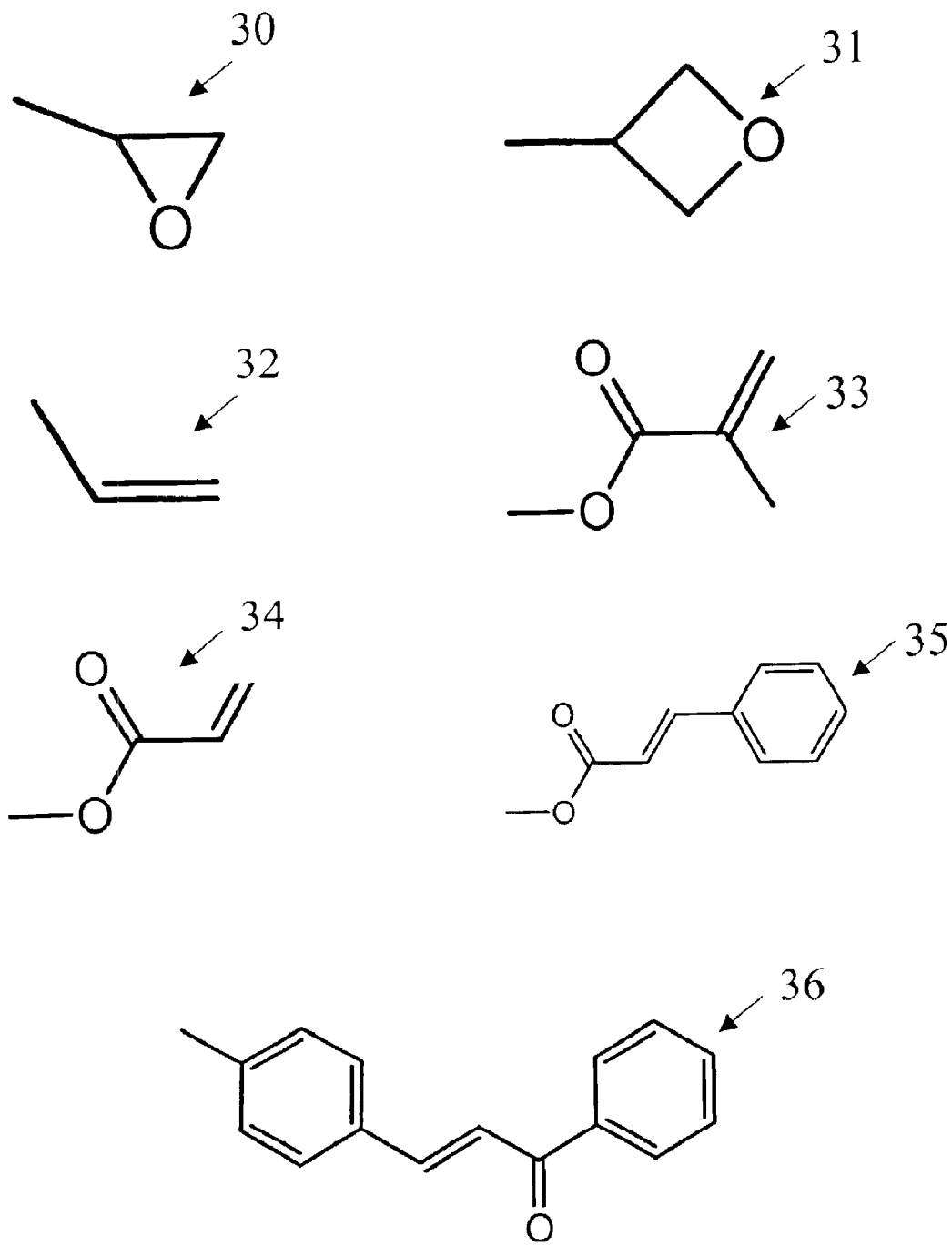

For the preparation of the sol-gel 43 described in FIG. 4*c*, 2.37 ml of pentafluorophenyl triethoxy silane is mixed with 0.16 ml of aqueous (0.01 M) HCl and the solution is stirred for 30 minutes. 2.01 ml of acryloxy methyl triethoxy silane is added and the solution is stirred for another 30 minutes. 0.16 ml of aqueous (0.01 M) HCl is added. After stirring the solution for 30 minutes, 0.62 ml of tributoxytitanium methacrylate is added. The solution is stirred again for 30 minutes. 0.04 ml of $H_2O$ is added and the solution is stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is then aged for several hours, diluted with 5 ml of ethanol (Volume ratio of precursor and solvent is 1:1) and stirred for a few minutes, followed by adding 0.71 ml of $H_2O$ to complete hydrolysis. After 30 minutes 0.03 ml of a photo-initiator HMPP (hydroxy methyl propiophenon) is added and whole solution is stirred and aged for 16 hrs before coating.

EXAMPLE 8

In this example, 2.06 ml of pentafluorophenyl trimethoxy silane is mixed with 0.18 ml of aqueous (0.01 M) HCl and the solution is stirred for 30 minutes. 2.25 ml of acryloxy methyl triethoxy silane is added and the solution is stirred for another 30 minutes. 0.18 ml of aqueous (0.01 M) HCl is added. After stirring the solution for 30 minutes, 0.69 ml of tributoxytitanium methacrylate is added. The solution is stirred again for 30 minutes. Then, 0.04 ml of $H_2O$ is added and the solution is stirred for 16 hours at ambient conditions. To obtain completely co-oligomer sol, all released solvents due to hydrolysis reaction are removed by rotavapor under reduced pressure 5 Torr for 60 min. After removal of solvents, highly viscous co-oligomer sols with Ti surrounded by Si are obtained. The solution is then aged for several hours, diluted with 5 ml of ethanol (Volume ratio of precursor and solvent is 1:1) and stirred for a few minutes, followed by adding 0.80 ml of $H_2O$ to complete hydrolysis. After 30 minutes 0.03 ml of a photo-initiator HMPP (hydroxy methyl propiophenon) is added and whole solution is stirred and aged for 16 hrs before coating.

Figure 8A:
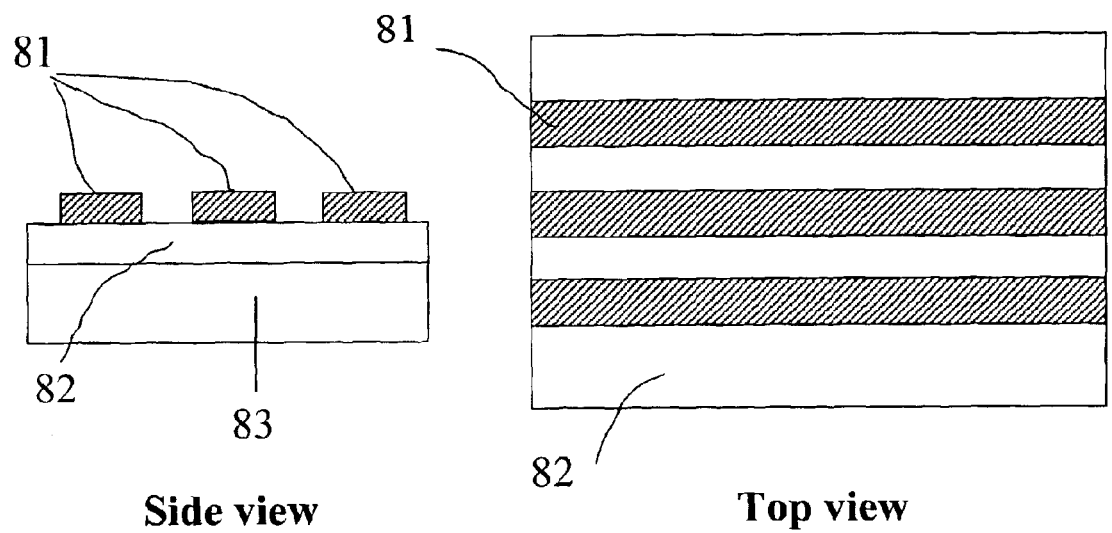
FIGS. 8a–8b depicts a straight ridge waveguide, and a 1×8 MMI splitter.
Figure 8B:
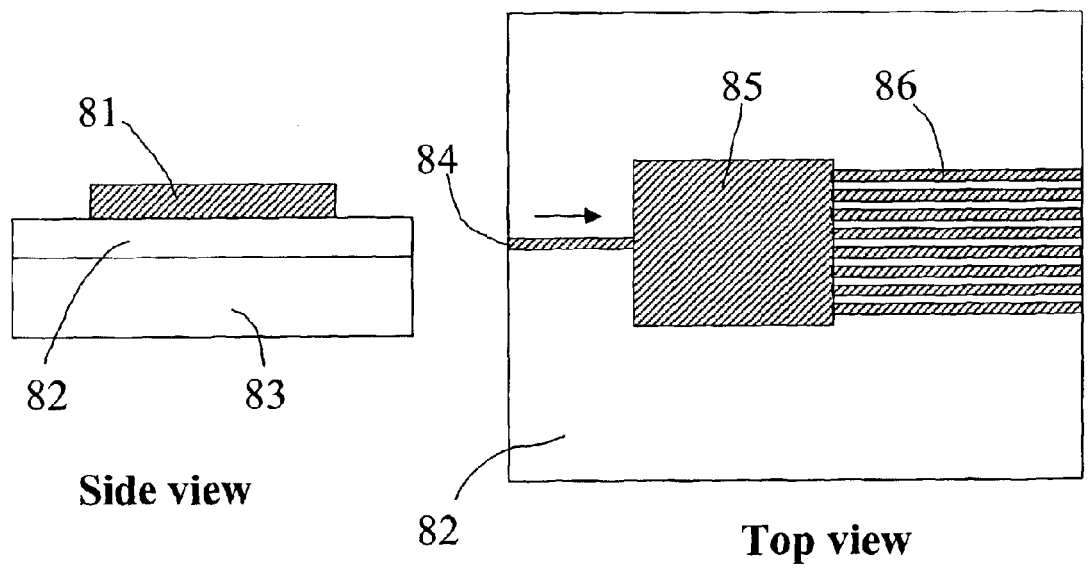

The sol-gel of the present invention makes possible the fabrication of optical components such as straight ridge waveguides (FIG. 8*a*), and a 1×8 multimode interference (MMI) splitter (FIG. 8*b*). Ridge waveguides 81 are fabricated with the sol-gel materials of the present invention onto a layer of SiO$_2$ 82 that is grown on top of a silicon substrate 83. In the example shown in FIG. 8b, a more complex structure 81 is fabricated in sol-gel on top of a SiO$_2$ layer 82 grown on top of a silicon substrate 83. The MMI splitter consists of a single mode waveguide section 84 connected to a multimode section 85. A laser beam coupled into 83 undergoes optical interference effects in the multimode section 85. These interference effects split the intensity of the beam into eight parts that are coupled into the waveguides 86. Thus, such a structure acts as an optical power splitter.

Figure 9:
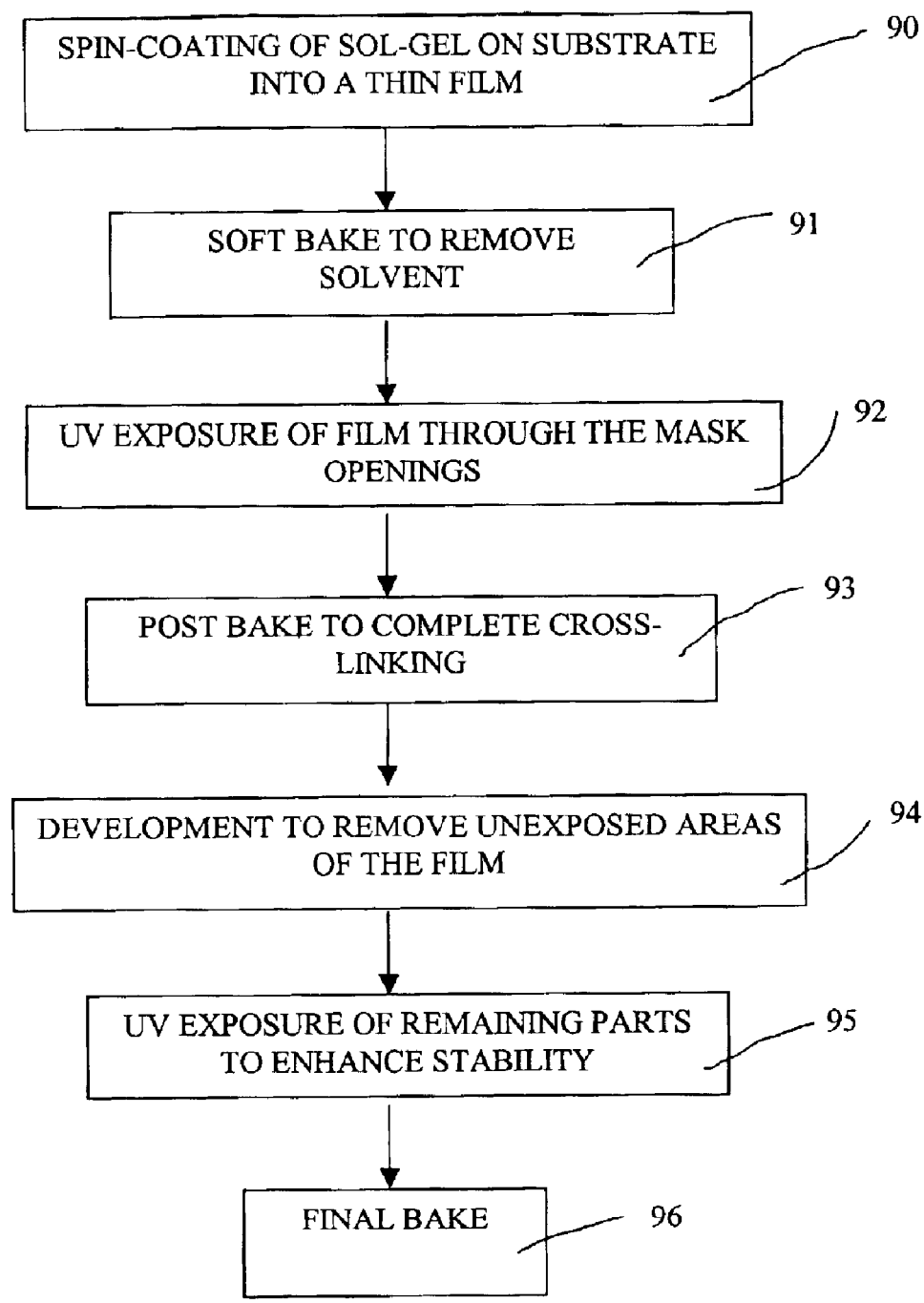
FIG. 9 is a flowchart of a method for fabricating optical waveguides.

These optical components are fabricated from the sol solutions according to the procedure shown in FIG. 9. The sol is spin-coated on a <100> Si wafer having a 12 μm-thick thermally grown SiO$_2$ buffer layer, using an RC8 spinner (step 90). Spinning is done initially at 2000 rpm with the cover on for a duration of 30 s, and followed by a 60 s spin at 1000 rpm with the cover off. The sample is then soft annealed at 95° C. for 5 min on a hot plate (step 91). The sample is then UV-exposed via a lithographic mask using a MA6 maskaligner (wavelength of 250 nm, 475W) (step 92). Exposure times are ranging from 1 to 5 minutes depending on film thickness. The sample is post annealed at 95° C. for 5 min on the hot plate (step 93). The features are developed for 30 s in isopropanol (step 94). The sample is then post UV-exposed for 1 min (step 95). The sample is immediately placed in an oven and baked in vacuum (25 mTorr) at 100° C. for 10 hrs (step 96). Then, the temperature is increased to 200° C. at a rate of 1° C./min and the sample is kept at 200° C. for 5 hrs (step 97).

Figure 10:
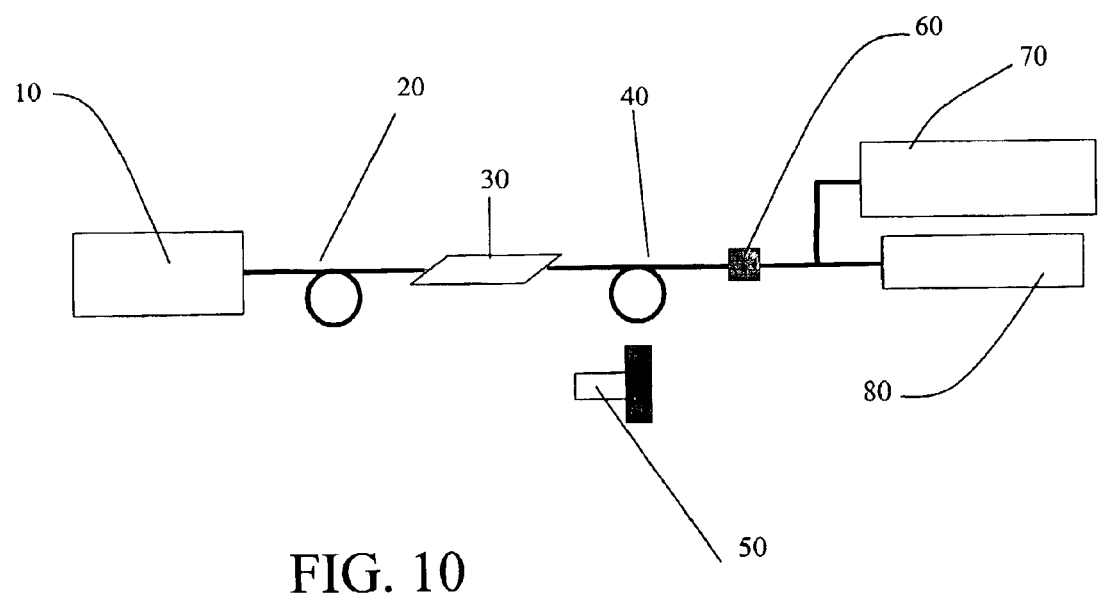
FIG. 10 is a schematic diagram of a set-up used to measure propagation losses in waveguides.

To measure the optical loss of the channel waveguides we used the fiber-end coupling technique. As show in FIG. 10, the light from a 1550 nm laser diode 100 is coupled into single-mode waveguides 102 via a single-mode fiber 104 and collected by a single-mode fiber 106. The light at the output of fiber 106 is collected by a detector 108 that is connected to a spectrum analyzer 110 and a power meter 112. The output of fiber 104 focused on the power meter 112 has an intensity $I_1$. In a subsequent step, without disturbing the input fiber 104, the output fiber 106 is replaced with an objective lens 114 of known transmission $T_o$. The light coming out of the waveguide 102 is collected by the objective 114 and directed onto the detector. The intensity recorded in this geometry is $I_2$. The waveguide sample 102 is then removed and intensity coming out of the fiber 104 is measured with the objective lens and sent on the detector 108. This defines intensity $I_3$. Knowing that the fiber transmission is $T_f$ the propagation losses in decibels is estimated from the following mathematical formula:

$$\alpha_p = 10 * \log_{10}(I_o I_2^2 T_f / I_1 I_3^2)$$

An average total loss of about 0.5 dB/cm was measured in several waveguides.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A mono-phase sol-gel composition with general formula

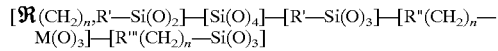

where O is oxygen, Si is silicon, M is a metal known to form bonds with organic compounds through oxygen donor ligands, and where ℜ, R" and R'" are photo cross-linkable groups, where R' is a perfluorinated aromatic group, and where (CH$_2$)$_n$ are alkyl spacers with n being an integer ≧0.

2. A sol-gel composition according to claim 1, wherein said metal alkoxyde M is titanium.

3. A sol-gel composition according to claim 1, wherein all said photo-crosslinkable groups ℜ, R" and R'" are selected from a group comprising cinnamate and chalcone.

4. A sol-gel composition according to claim 3, wherein the sol-gel has a refractive index higher than 1.45 and an optical loss lower than 1 dB/cm at wavelengths ranging between 1300 and 1600 nm.

5. A sol-gel composition according to claim 1, wherein at least one of said photo-crosslinkable groups ℜ, R" and R'" are selected from the group of epoxy, oxetanyl, vinyl, methacryloxy, acryloxy, and wherein the composition contains a small amount of photoinitiator.

6. A sol-gel composition according to claim 5, wherein the sol-gel has a refractive index higher than 1.45 and an sol-gel has an optical loss lower than 1 dB/cm at wavelengths ranging between 1300 and 1600 nm.

7. A sol-gel composition according to claim 1, wherein in the general formula

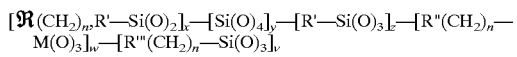

the bracketed terms are precursors and x,y,z,w and v are the molar percentages of the precursors where x is between 40 and 50, y is between 0 and 20, z is between 40 and 50, w is between 5 and 10, and v is between 30 and 50.

8. A sol-gel composition according to claim 1, wherein the sol-gel material is prepared according to the steps of:

a. mixing two organically modified silane precursors with general formulas [R'—Si(OR)$_3$] and [Si(OR)$_4$] where R is either CH$_3$ or C$_2$H$_5$, and where R' is a perfluorinated aromatic group, with an aqueous acidic solution, and stirring until the OR groups are partially hydrolyzed;

b. Adding an organically modified silane precursor with general formula [ℜ(CH$_2$)$_n$R'—Si(OR)$_3$] where ℜ is a photo-crosslinkable group, and stirring the solution until the compounds are mixed;

c. Adding an aqueous acidic solution and stirring until the OR groups in silane precursor added in step b are partially hydrolyzed;

d. Adding an organometallic silane precursor with general formula [R"(CH$_2$)$_n$—Ti(OR)$_3$], where R" is a photo-crosslinkable group that is selected from the same group as ℜ but is not necessarily identical and R is CH$_3$ or C$_2$H$_5$, and stirring to yield a substantially homogeneous solution;

e. Adding aqueous solution and stirring to partially hydrolyze the precursor added in step d;

f. Removing solvent and stirring to facilitate condensation and aging;

g. Adding solvent and aqueous solution, and stirring to further complete hydrolysis; and h. Aging the solution until condensation yields viscous liquid.

9. A sol-gel composition prepared according to claim 8, wherein the photo-crosslinkable groups ℜ and R" are selected from a group comprising cinnamate and chalcone.

10. A sol-gel composition prepared according to claim 8, wherein the photo-crosslinkable groups ℜ and R" are selected from the group of epoxy, oxetanyl, vinyl, methacryloxy, acryloxy, and where a small amount of photoinitiator is added to the solution during step g.

11. A sol-gel composition according to claim 1, wherein the sol-gel material is prepared according to the steps of:
  a. mixing an organically modified silane precursor with general formula [R'—Si(OR)$_3$] where R is either CH$_3$ or C$_2$H$_5$ and where R' is a perfluorinated aromatic group with an aqueous acidic solution, and stirring until the OR groups are partially hydrolyzed;
  b. Adding an organically modified silane precursor with general formula [ℜ(CH$_2$)$_n$R'—Si(OR)$_3$] where ℜ is a photo-crosslinkable group, and stirring the solution until the compounds are mixed;
  c. Adding an aqueous acidic solution and stirring until the OR groups in the second silane precursor are partially hydrolyzed;
  d. Adding a third organometallic silane precursor with general formula [R"(CH$_2$)$_n$—Ti(OR)$_3$], where R" is a photo-crosslinkable group that is selected from the same group as ℜ but is not necessarily identical and R is CH$_3$ or C$_2$H$_5$, and stirring to yield a substantially homogeneous solution;
  e. Adding aqueous solution and stirring to partially hydrolyze the third precursor;
  f. Removing solvent and stirring to facilitate condensation and aging;
  g. Adding solvent and aqueous solution, and stirring to further complete hydrolysis; and
  h. Aging the solution until condensation yields viscous liquid.

12. A sol-gel composition prepared according to claim 11, wherein the photo-crosslinkable groups ℜ and R" are selected from a group comprising cinnamate and chalcone.

13. A sol-gel composition prepared according to claim 11, wherein the photo-crosslinkable groups ℜ and R" are selected from the group of epoxy, oxetanyl, vinyl, methacryloxy, acryloxy, and where a small amount of photoinitiator is added to the solution during step g.

14. A sol-gel composition according to claim 1, wherein the sol-gel material is prepared according to the steps of:
  a. mixing pentafluorophenyl triethoxy silane with an aqueous acidic solution, and stirring until the ethoxy groups are partially hydrolyzed;
  b. Adding pentafluorophenyl vinyl diethoxy silane and stirring the solution until the compounds are mixed;
  c. Adding an aqueous acidic solution and stirring until the ethoxy groups in the second silane precursor are partially hydrolyzed;
  d. Adding tributoxytitanium methacrylate and stirring to yield a substantially homogeneous solution;
  e. Adding aqueous solution and stirring to partially hydrolyze the butoxy groups of the third precursor;
  f. Removing solvent and stirring to facilitate condensation and aging;
  g. Adding solvent and aqueous solution, and stirring to further complete hydrolysis;
  h. Adding a photo-initiator, stirring; and
  i. Aging the solution until condensation yields viscous liquid.

15. A sol-gel composition according to claim 1, wherein the sol-gel material is prepared according to the steps of:
  a. mixing pentafluorophenyl triethoxy silane and tetraethoxy silane with an aqueous acidic solution, and stirring until the ethoxy groups are partially hydrolyzed;
  b. Adding pentafluorophenyl allyl diethoxy silane and stirring the solution until the compounds are mixed;
  c. Adding an aqueous acidic solution and stirring until the ethoxy groups in the second silane precursor are partially hydrolyzed;
  d. Adding tributoxytitanium methacrylate and stirring to yield a substantially homogeneous solution;
  e. Adding aqueous solution and stirring to partially hydrolyze the butoxy groups of the third precursor;
  f. Removing solvent and stirring to facilitate condensation and aging;
  g. Adding solvent and aqueous solution, and stirring to further complete hydrolysis;
  h. Adding a photo-initiator, stirring; and
  i. Aging the solution until condensation yields viscous liquid.

16. A sol-gel composition according to claim 1, wherein the sol-gel material is prepared according to the steps of:
  a. mixing pentafluorophenyl triethoxy silane with an aqueous acidic solution, and stirring until the ethoxy groups are partially hydrolyzed;
  b. Adding acryloxy methyl triethoxy silane and stirring the solution until the compounds are mixed;
  c. Adding an aqueous acidic solution and stirring until the ethoxy groups in the second silane precursor are partially hydrolyzed;
  d. Adding tributoxytitanium methacrylate and stirring to yield a substantially homogeneous solution;
  e. Adding aqueous solution and stirring to partially hydrolyze the butoxy groups of the third precursor;
  f. Removing solvent and stirring to facilitate condensation and aging;
  g. Adding solvent and aqueous solution, and stirring to further complete hydrolysis;
  h. Adding a photo-initiator, stirring; and
  i. Aging the solution until condensation yields viscous liquid.

17. A method a making a ridge waveguide on a substrate, comprising the steps of:
  a. coating a mono-phase sol-gel into a film on a portion of the substrate, said mono-phase sol-gel having a general formula

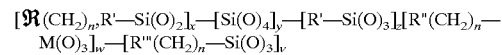

where O is oxygen, Si is silicon, M is metal alkoxyde known to form bonds with organic compounds through oxygen donor ligands, and where ℜ, R" and R'" are photo crosslinkable groups, where R' is a perfluorinated aromatic group, and where (CH$_2$)$_n$ are alkyl spacers with n being an integer $\geq 0$;
  b. soft baking the film to remove solvent;
  c. applying a photomask to the sol-gel film, the photomask having at least one opening outlining the ridge waveguide;
  d. exposing a portion of the sol-gel film with ultra-violet radiation through the opening in the photomask to render the exposed portion of the film insoluble to a given solvent through the full thickness of the film and to define the waveguide in the film;

e. post-baking the film and substrate to complete crosslinking;

f. developing by dissolving the unexposed portion of the sol-gel film in a solvent, leaving the ridge waveguide on the substrate;

g. post-exposing the ridge waveguide to ultraviolet light to enhance the stability of the film; and h. Hard-baking the waveguide in a vacuum oven.

18. A method according to claim 17, wherein the substrate is a silicon wafer having a thick thermally grown $SiO_2$ buffer layer.

19. A method according to claim 17, wherein the ridge waveguides are bent or straight channel waveguides.

20. A method according to claim 17, wherein the ridge waveguides consist of 1×N optical power splitters where N is an integer higher than 2.

21. A method according to claim 17, wherein the ridge waveguides consist of multimode interference power splitters.

22. A method according to claim 17, wherein the ridge waveguides consist of cascading 3 dB Y-junctions.

23. A method according to claim 17, wherein the ridge waveguides is comprised of arrayed waveguide grating routers.

24. A mono-phase sol-gel composition selected from the group consisting of:

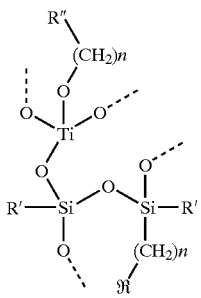
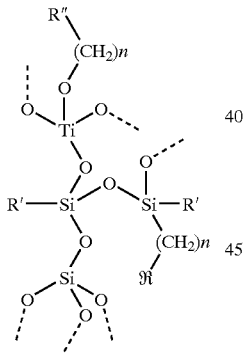

-continued

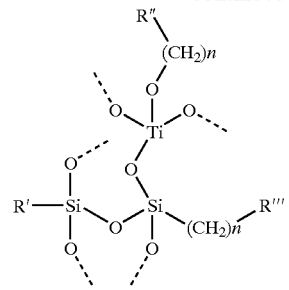

and mixtures thereof, where ℜ, R", and R'" are selected from the group of epoxy, oxetanyl, vinyl, methacryloxy, acryloxy, chalcone and cinnamate, and where R' is pentafluorophenyl, and n is an integer $\geq 0$.

25. A mono-phase sol-gel composition selected from the group consisting of:

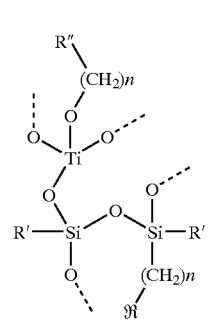
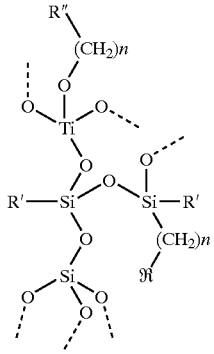

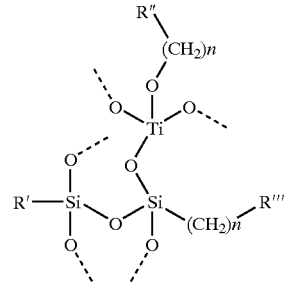

and mixtures thereof, where ℜ, R", and R'" are selected from the group of epoxy, oxetanyl, vinyl, methacryloxy, acryloxy, chalcone and cinnamate, and where R' is a perfluorinated aromatic group, and n is an integer $\geq 0$.

* * * * *